United States Patent [19]

d'Aragona et al.

[11] Patent Number: 5,314,107

[45] Date of Patent: May 24, 1994

[54] AUTOMATED METHOD FOR JOINING WAFERS

[75] Inventors: Frank S. d'Aragona; Raymond C. Wells, both of Scottsdale; Sherry L. F. Helsel, Apache Junction, all of Ariz.

[73] Assignee: Motorola, Inc., Schaumburg, Ill.

[21] Appl. No.: 999,342

[22] Filed: Dec. 31, 1992

[51] Int. Cl.$^5$ .................................. H01L 21/30
[52] U.S. Cl. .................................. 228/116; 414/404; 414/416; 414/938; 437/925
[58] Field of Search .............. 228/116, 123, 903, 175, 228/227; 437/925; 414/786, 416, 404, DIG. 4; 51/283 R

[56] References Cited

U.S. PATENT DOCUMENTS

| | | | |
|---|---|---|---|
| 4,695,217 | 9/1987 | Lau | 414/404 |
| 4,739,589 | 4/1988 | Brehm et al. | 51/118 X |
| 4,854,986 | 8/1989 | Raby | 156/87 |
| 4,856,957 | 8/1989 | Lau et al. | 414/404 |
| 4,883,215 | 11/1989 | Goesele et al. | 228/116 |
| 4,947,784 | 8/1990 | Nishi | 414/404 |
| 4,962,879 | 10/1990 | Goesele et al. | 228/903 |
| 5,035,087 | 7/1991 | Nishiguchi et al. | 51/131.3 X |
| 5,069,002 | 12/1991 | Sandhu et al. | 51/283 R X |

FOREIGN PATENT DOCUMENTS

| | | | |
|---|---|---|---|
| 1-160950 | 7/1986 | Japan | 437/925 |
| 62-71215 | 1/1987 | Japan | |
| 62-132340 | 6/1987 | Japan | 414/DIG. 4 |

OTHER PUBLICATIONS

"Expanding The Horizons of Technology, Phoenix Series V2, Wafer Management Systems", MGI Systems, publication SL-301R, May 1989.
J. B. Lasky et al, "Silicon on Insulator (SOI) by Bonding and Etch-Back"; IEDM 85 p. 684, 1985.
M. Shimbo et al, "Silicon-to-silicon direct bonding method", J. Appl. Phys. 60(8), 15 Oct. 1986, p. 2987.
J. Haisma et al, "Silicon-on-Insulator Wafer Bonding-Wafer Thinning Technological Evaluations", Japanese Journal of Applied Physics, vol. 28, No. 8, Aug. 1989, pp. 1426-1443.

Primary Examiner—Kurt C. Rowan
Assistant Examiner—Jeanne M. Elpel
Attorney, Agent, or Firm—Joe E. Barbee

[57] ABSTRACT

A method for joining a number of first and second wafers (11,12) having one polished surface in preparation for direct wafer bonding is provided. The method involves placing a number of first (11) and the same number of second (12) wafers into slots (16) of a retainer (14) so that each of the polished surfaces of the number of first wafers (11) is forced to contact one of the polished surfaces of the number of second wafers (12).

13 Claims, 3 Drawing Sheets

AUTOMATED METHOD FOR JOINING WAFERS

BACKGROUND OF THE INVENTION

The present invention relates, in general, to bonding of silicon wafers to another semiconducting or semi-insulating substrate and, more particularly, to an automated method for bonding a plurality of wafers at the same time.

Silicon wafer bonding, which is bonding a silicon wafer to another silicon wafer, is a useful replacement for conventional epitaxial processing. Unprocessed or partially processed silicon top wafers can be bonded to an insulating bottom wafer or substrate to form a silicon on insulator (SOI) structure. Some recent applications take advantage of the flexibility of wafer bonding to created devices in which both the top and bottom wafers are processed to provide devices with complex buried layer structures.

Bonding two wafers to each other is usually accomplished by bonding one wafer pair at a time using an apparatus similar to that shown in U.S. Pat. No. 4,883,215 issued to Goesele et al on Nov. 28, 1989. Bonding one wafer at a time, however, is a slow and expensive process. Moreover, prior single wafer bonders require manual handling of wafers resulting in dirty wafers and unpredictable yields. Further, previous manual wafer bonding method have relatively low productivity, resulting in increased costs for the useful and valuable bonded wafer substrates.

Another problem with previous wafer bonding methods is that the wafers were joined prior to permanent bonding in a horizontal orientation. The horizontal orientation causes dust and contamination to land on the wafers which is trapped during bonding. Trapped dust and contamination causes voids, which are also called bubbles, in the bonded wafer.

What is needed is an automated method for joining wafers that provides high productivity, low cost, and reproducible void-free bonded wafers. Moreover, a method of wafer bonding is needed that can be integrated with existing semiconductor wafer handling equipment to allow cassette-to-cassette transfer. Also, a method for joining wafers is needed that reduces particulate contamination problems associated with previous manual wafer bonding methods.

SUMMARY OF THE INVENTION

Briefly stated, the advantages of the present invention are achieved by a method for joining a number of first and second wafers having one polished surface in preparation for direct wafer bonding. The method involves placing a number of first and the same number of second wafers into slots of a retainer so that each of the polished surfaces of the number of first wafers is forced to contact one of the polished surfaces of the number of second wafers.

DETAILED DESCRIPTION OF THE DRAWINGS

The method in accordance with the present invention is described in terms of direct wafer bonding (DWB) which involves permanently bonding two silicon wafers to form a single DWB substrate. The DWB substrate includes two wafers that are mechanically and electrically coupled together. One or both of the unbonded silicon wafers may have semiconductor devices, or portions of semiconductor devices formed therein prior to being bonded. Usually additional processing using conventional semiconductor processing techniques is performed after the bonding operation to complete formation of semiconductor devices and integrated circuits in the DWB substrate.

Figure 3:
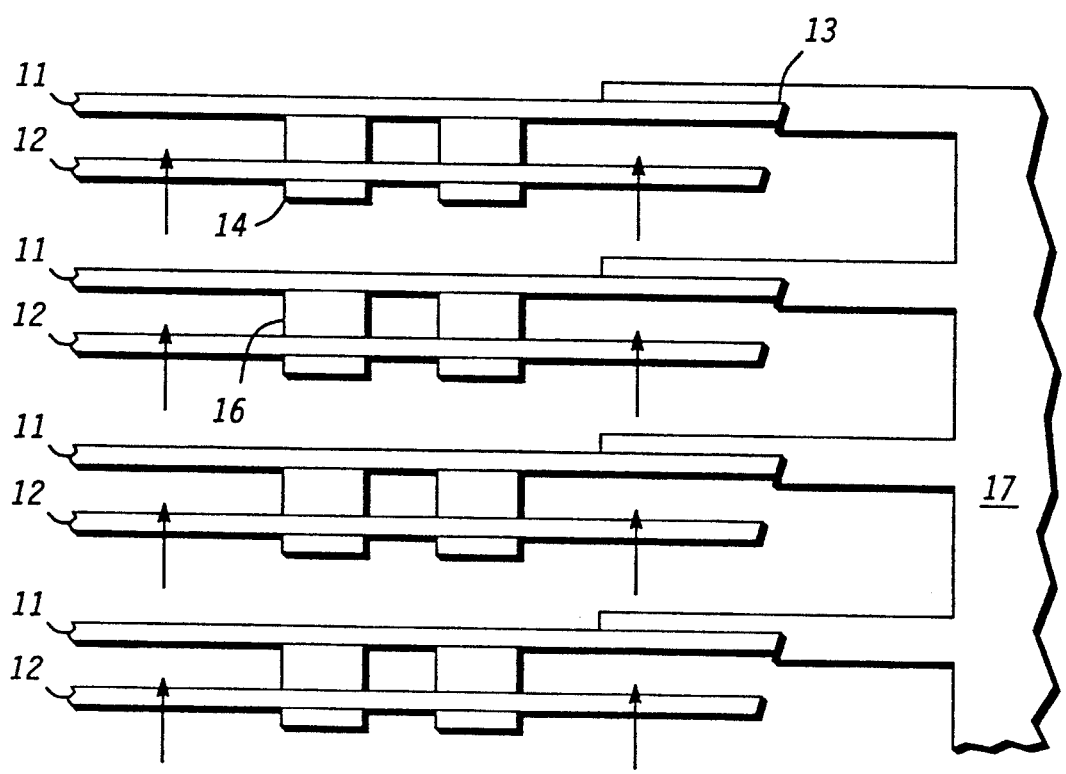
FIG. 3 illustrates a top-down view of a portion of the apparatus shown in FIG. 2.

For ease of understanding, the method in accordance with the present invention is described in terms of two sets of wafers, as indicated in FIG. 3. A first set of wafers, preferably silicon wafers, are provided having at least one mirror polished surface. A second set of wafers having at least one mirror polished surface are also provided. It should be understood that either or both of the first or second sets of wafers may include other semiconductor or semi-insulating materials such as III-V compound semiconductor, IV-VI compound semiconductors, or the like. For all practical purposes, the first and second sets of wafers can be identical. Also, one of the wafers can be semi-insulating, or may comprise an insulating material such as silicon oxide or glass. Although the process for permanent bonding may vary depending on the particular materials used for the first and second sets of wafers, the method for joining the wafers in accordance with the present invention is believed to work with all types of substrates.

Figure 1:
FIG. 1 illustrates a flow chart of a portion of process for joining wafers in accordance with the present invention.

As shown in the flow chart of FIG. 1, the first and second set of wafers can be loaded together in a single cassette-type wafer carrier. Alternatively, each set of wafers will be loaded in separate carriers, particularly when the first set of wafers has been processed differently from the second set of wafers prior to wafer bonding. The wafer carrier has a number of slots for holding the wafers in a vertical orientation, and typically is made of Teflon or the like. The wafers are loaded in the carrier so that the polished surfaces face the same direction, and each slot of the carrier holds a single wafer. In a particular example, each set of wafers comprises twelve silicon wafers, although larger or smaller sets of wafers are possible.

In one embodiment, the first set of wafers is removed from the wafer carrier using an automated wafer handling tool such as the Phoenix Series V2 wafer handler manufactured by MGI Systems of Tempe, Ariz. Unlike prior wafer joining methods, the method in accordance with the present invention requires no manual handling of the wafers, and can be performed using a conventional wafer handling apparatus such as the Phoenix Series V2 with low cost equipment modification described hereinafter. The first set of wafers is held by the wafer handling apparatus.

The second set of wafers is then positioned so that each of the polished surfaces of the second set of wafers is facing 180 degrees away from the polished surface of the first set of wafers. In other words, the polished surface of the first set of wafers faces in an opposite direction from the polished surface of the second set of wafers. This is conveniently accomplished by rotating the wafer carrier 180 degrees.

The second set of wafers is then removed from the wafer carrier and placed into the slots of a retainer 14, where each slot holds one wafer. The first and second set of wafers are then interleaved by moving retainer 14, which holds the second set of wafers, into close proximity to the first set of wafers. The Phoenix Series V2 wafer handler, for example, accomplishes the removal and interleave steps automatically. After interleaving, a wafer from the first set of wafers is placed in a slot with one of the second set of wafers, where a slot holds one wafer from the first set of wafers and one wafer from the second set of wafers. The periphery of each of the first set of wafers is preferably aligned to the periphery of one of the second set of wafers with which it is paired. Likewise, flat regions are typically formed on the periphery of silicon wafers, hereinafter called wafer flats, and it is important to align the wafer flats to ensure rotational alignment between each of the first set of wafers and one of the second set of wafers with which it is paired.

Figure 5:
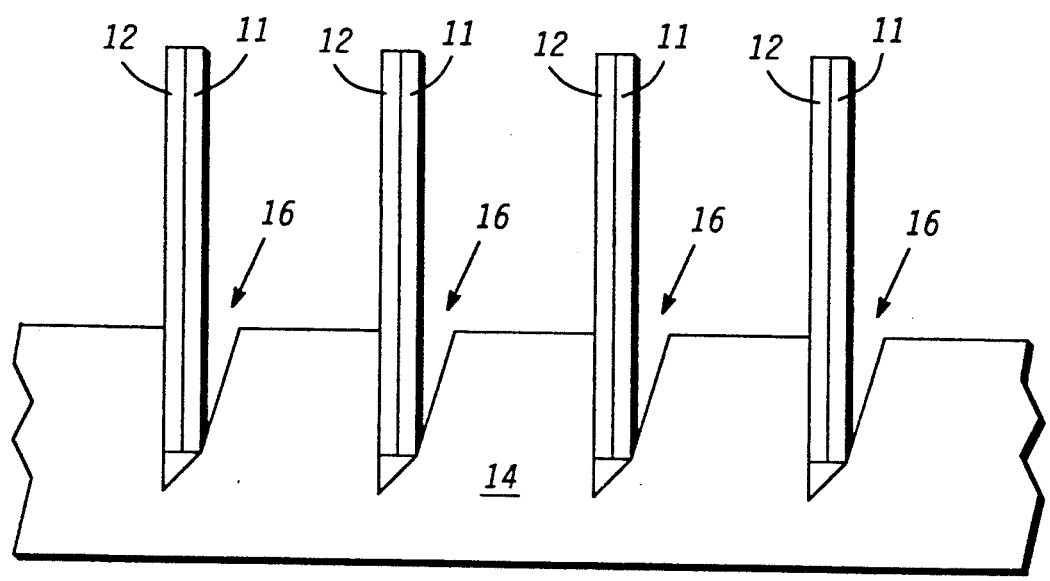
FIG. 5 illustrates a cross-sectional view from the side of a retainer for holding joined wafers.

Retainer 14, shown in FIG. 5, hold's the temporarily joined first and second sets of wafers. Each of the first set of wafers and each of the second set of wafers are placed into receiving slots formed in the retainer.

It is important that the wafers do not slide against each other during the joining process. Wafer pairs that slide result in scratches, contamination and bubbles in the joined wafer pair, resulting in unusable product. A particularly advantageous feature of the method in accordance with the present invention is the low amount of sliding that occurs due to the automated nature of the process. Any number of pairs of wafers can be temporarily joined at the same time. Typically, twelve pairs of wafers are formed from twenty-four wafers. Since the entire joining process described above takes less than one minute to complete, large numbers of wafer pairs are formed in a short time.

After the wafers are temporarily joined, each pair is pressed at one spot using a rigid probe. The pressing causes a bonding wave to propagate through the wafers, permanently joining the pair. Although permanently joined wafers can be processed further at this stage, they are not yet bonded. Bonding occurs by heat treating the permanently joined wafer pair in a furnace or rapid thermal anneal apparatus for a short time creating a stronger bond between the pair of wafers.

Figure 2:
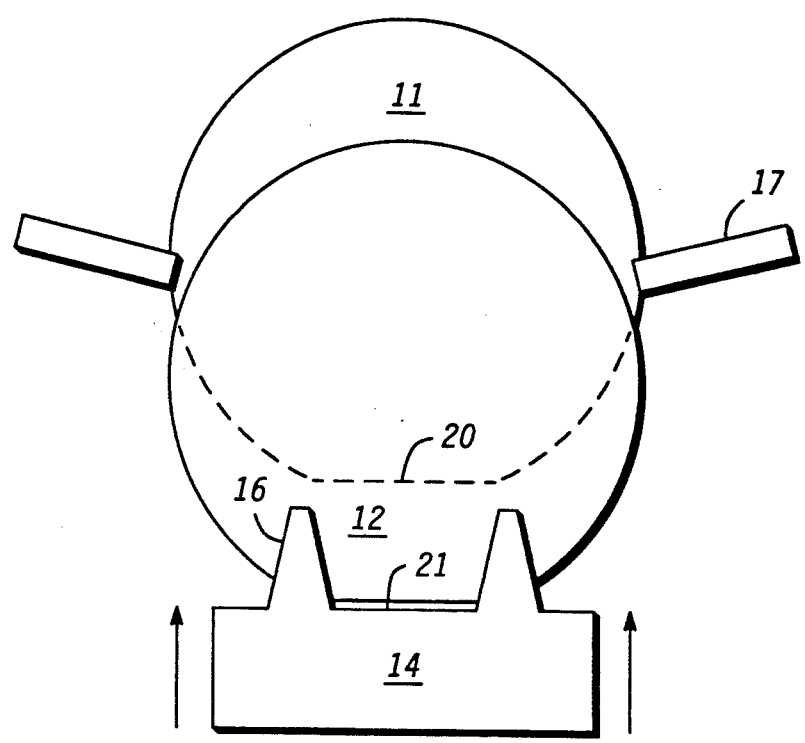
FIG. 2 illustrates a front view of a portion of a wafer handling apparatus useful in the practice of the method in accordance with the present invention.

More specifically FIG. 2 illustrates a front view of a portion of a wafer handling apparatus useful in the practice of the present invention. Wafers 11 and 12 are typically round slices with one or more flat portions 20 and 21 formed in the periphery. The preferred arrangement of retainer 14 comprises plastic, glass, silicon, metal, graphite, or the like in which slots 16 are formed. Construction of wafer boats like retainer 14 is well known in the semiconductor industry, and the arrangement shown in FIG. 2 is a typical, but not an exclusive means for providing a retainer 14.

First set of wafers 11 and second set of wafers 12 are placed in slots 16 of retainer 14. Retainer 14 moves up and down vertically to lift wafers 11 and 12 to side holding vanes 17. Side holding vanes 17, which are illustrated in greater detail in FIG. 3, hold first set of wafers 11 while second set of wafers 12 remain in retainer 14. Second set of wafers 12 are then lowered and rotated 180 degrees so that the polished surface of the second set of wafers 12 faces the polished surface of the first set of wafers 11.

Retainer 14 then lifts second set of wafers 12 towards side holding vanes 17 and interleaves first and second sets of wafers 11 and 12, as is suggested in FIG. 2. The lower portion of wafer 11 which is behind wafer 12 is illustrated in phantom to indicate that it is hidden from view by wafer 12. Retainer 14 continues to lift wafers 12 until they are in rough vertical alignment with wafers 11 which are in side holding vanes 17.

FIG. 3 illustrates the method in accordance with the present invention after first set of wafers 11 and second set of wafers 12 are in vertical alignment. First set of wafers 11 are held in an angle 13 of side holding vanes 17. Side holding vane 17 should include one angle 13 for each pair of wafers to be joined. Second set of wafers 12 are held in slot 16 of retainer 14, and are moved horizontally to bring them in proximity with first set of wafers 11. Angle 13 is preferably large enough to allow good alignment between the periphery of first wafers 11 and second wafers 12, and to prevent sliding between wafers 11 and 12 to align them. As wafers 12 are moved into contact with wafers 11, side holding vanes 17 are moved to release first wafers 11 into slot 16 of retainer 14.

Figure 4:
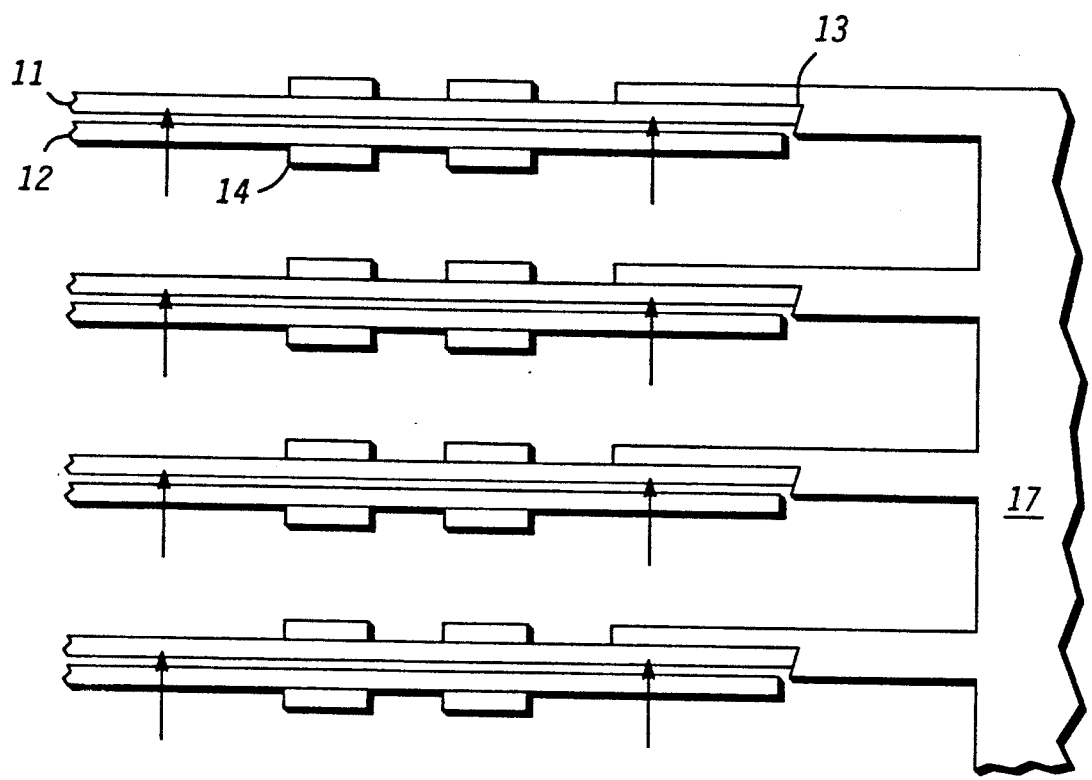
FIG. 4 shows the top-down view of FIG. 3 at a later stage in the process in accordance with the present invention.

As shown in FIG. 4, retainer 14 moves to position all of the second set of wafers 12 in proximity with first set of wafers 11. At this time, wafers 11 and 12 may actually join or may instead remain in close proximity for later joining. Retainer 14 should move smoothly and directly towards wafer 11 after wafers 12 and 11 are aligned, so that the wafers do not slide against each other after contacting. Angle 13 should be wide enough to allow proper alignment of first wafers 11 to second wafers 12. Depending on the material composition and surface condition of first set of wafers 11 and second set of wafers 12, temporary joining will occur during or soon after wafers 11 and 12 come into contact at side holding vanes 17.

FIG. 5 illustrates a cross-sectional view of retainer 14. Each slot 16 is formed from first and second surfaces which meet to form a base of slot 16. In a preferred embodiment, the base of slot 16 has a large enough angle to retain adequate vertical alignment of wafers 11 to wafers 12, and may in fact be flat at the bottom. Wafers 11 fall into each slot of retainer 14 behind wafers 12.

Wafers 11 and 12 are preferably maintained in a substantially vertical orientation when placed in retainer 14 to minimize particulate contamination. It should be noted that all steps of the present invention are preferably performed while the first and second sets of wafers 11 and 12 are maintained in a vertical orientation. Because the method in accordance with the present invention allows this vertical orientation, wafer contamination is greatly reduced and yield is enhanced.

By now it should be appreciated that a method for joining wafers in preparation for direct wafer bonding is provided. Application and modification of existing semiconductor wafer handling equipment allows automation of wafer joining and eliminates variability and low productivity created by previous manual methods. Although existing wafer handling equipment is designed to maintain separation of unpolished surfaces of a pair of wafers, modification in the equipment in accordance with the method of the present invention allows high productivity joining of polished surfaces of a pair of wafers. Elimination of manual handling increases yield, reduces contamination, and improves quality significantly.

We claim:

1. An automated method for joining two silicon wafers in preparation for direct wafer bonding comprising the steps of:
   providing a plurality of first wafers having at least one polished surface; providing a plurality of second wafers having at least one polished surface;
   positioning the second set of wafers so that the polished surface of each of the second set of wafers faces 180 degrees from the polished surface of each of the first set of wafers; interleaving the first and second sets of wafers;
   providing a retainer having a plurality of receiving slots for holding the wafers; and
   placing the first and second set of wafers in the retainer so that each receiving slot holds one of the first set of wafers and one of the second set of wafers, wherein each of the polished surfaces of the first set of wafers physically contacts the polished surface of one of the second set of wafers to provide a temporarily joined pair of wafers.

2. The method of claim 1 further including aligning an outer periphery of each of the first set of wafers to an outer periphery of one of the second set of wafers before the step of simultaneously placing the first and second wafers in the retainer.

3. The method of claim 1 further comprising the step of permanently joining each temporarily joined pair with a bonding wave by pressing each of the temporarily joined pairs of wafers at one spot.

4. The method of claim 1 wherein each of the first and second sets of wafers are circle shaped and include a flat portion on the periphery, and the method further comprises the step of aligning the flat portion of each of the first set of wafers to the flat portion of each of the second set of wafers before the step of placing the first and second wafers in the retainer.

5. The method of claim 1 wherein each of the polished surfaces are positioned vertically during the step of placing the first and second wafers in the retainer.

6. The method of claim 5 wherein each of the polished surfaces are positioned vertically at all steps of the method for joining two silicon wafers in preparation for direct wafer bonding.

7. An automated method for bringing a first set of wafers into proximity to a second set of wafers in preparation for direct wafer bonding comprising the steps of:
   providing a first set of n wafers, each of first set of wafers having a mirror polished surface; providing a second set of n wafers, each of the second set of wafers having a mirror polished surface;
   aligning the first set of n wafers to the second set of n wafers;
   bringing the first set of n wafers into close proximity with the second set of n wafers so that the polished surface of each of the first set of n wafers faces and is spaced apart from the polished surfaces of one of the second set of n wafers; and
   placing the first and second set of n wafers into a retainer having n receiving slots, wherein each receiving slot holds one of the first set of wafers and one of the second set of wafers.

8. An automated method for joining a number of first and second wafers in preparation for direct wafer bonding comprising the steps of:
   providing a number of first wafers having one polished surface;
   providing a number of second wafers having one polished surface;
   providing a retainer having a number of receiving slots, each of the receiving slots including a first surface and a second surface, wherein the first and second surfaces meet to form an angle at a base of the slot;
   placing the number of first and the number of second wafers in the number of receiving slots so that each of the polished surfaces of the number of first wafers is forced to contact one of the polished surfaces of the number of second wafers to form a temporarily joined pair of wafers; and
   pressing each of the temporarily joined wafers at one spot to permanently join each of the temporarily joined pair of wafers with a bonding wave.

9. An automated method for joining two semiconductor wafers in preparation for direct wafer bonding comprising the steps of:
   providing a plurality of first wafers having at least one polished surface; providing a plurality of second wafers having at least one polished surface;
   providing a retainer having a plurality of receiving slots for holding the first set and the second set of wafers;
   placing the first and second wafers into the retainer so that each receiving slot holds a single wafer; removing the first set of wafers from the retainer;
   interleaving the first and second sets of wafers in the retainer so that each receiving slot holds one of the first set of wafers and one of the second set of wafers, wherein the polished surface of each of the first set of wafers physically contacts the polished surface of one of the second set of wafers to provide a temporarily joined pair of wafers; and
   pressing each of the temporarily joined wafers at one spot to permanently join each of the temporarily joined pair of wafers with a bonding wave.

10. The method of claim 9 further including aligning an outer periphery of each of the first set of wafers to an outer periphery of one of the second set of wafers before the step of placing the first set of wafers into the retainer.

11. The method of claim 9 wherein each of the first and second sets of wafers are circled shaped and include a flat portion on the periphery, and the method further comprises the step of aligning the flat portion of each of the first set of wafers to the flat portion of the second set of wafers before the step of placing the first set of wafers into the retainer.

12. The method of claim 9 wherein each of the polished surfaces are positioned vertically while being received by the retainer.

13. The method of claim 12 wherein each of the polished surfaces are positioned vertically at all steps of the method for joining two semiconductor wafers in preparation for direct wafer bonding.

* * * * *